(12) United States Patent
Ting

(10) Patent No.: US 7,086,895 B1
(45) Date of Patent: Aug. 8, 2006

(54) CARD CONNECTOR

(75) Inventor: Chien Jen Ting, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/323,585

(22) Filed: Dec. 30, 2005

(30) Foreign Application Priority Data

Mar. 11, 2005 (TW) .............................. 94203784 U

(51) Int. Cl.
*H01R 13/60* (2006.01)

(52) U.S. Cl. ................................................ 439/541.5

(58) Field of Classification Search ............. 439/541.5, 439/630, 607
See application file for complete search history.

(56) References Cited

U.S. PATENT DOCUMENTS 5,399,105 A * 3/1995 Kaufman et al. ........... 439/609
6,068,500 A * 5/2000 Kantner ...................... 439/218
6,238,240 B1   5/2001 Yu
6,341,964 B1 * 1/2002 Yu .............................. 439/79
6,863,571 B1 * 3/2005 Sato et al. .................. 439/630

* cited by examiner

*Primary Examiner*—Tho D. Ta
(74) *Attorney, Agent, or Firm*—Wei Te Chung

(57) ABSTRACT

A card connector includes an insulating housing (10) and a number of contacts (20) received in the insulating housing (10). The insulating housing (10) comprises a base (11) and a pair of guiding arms (12) extending from opposite lateral sides of the base (11) along a card ejecting direction and defining a card receiving space; The insulating housing (10) is formed with a pair of mating portions (13) in which the contacts (20) are received, The mating portions extend from the base (11) along the card ejecting direction to expose into the card receiving space at a position of upper and lower sides. Each guiding arm (12) is formed with one or more intermediate portions (123) between the mating portions (13) to sustain the electrical card electrically connect with the corresponding mating portion (13).

9 Claims, 6 Drawing Sheets

CARD CONNECTOR

BACKGROUND OF THE INVENTION

1. Field of the Invention

The present invention is generally related to a card connector, and especially to a stacked card connector.

2. Description of Related Art

At present, electrical cards are widely used in electrical appliances to accomplish signal transmission or signal storage function. Certainly, card connectors are indispensable for receiving the corresponding electrical cards. With requirements of larger capacity of the electrical appliances, on the one hand, enlarging capacity of the electrical cards themselves; on the other hand, adding quantities of the card connectors in the electrical appliances to receive more electrical cards. Thus, a stacked card connector arises.

U.S. Pat. No. 6,238,240 discloses a stacked card connector. The stacked card connector comprises a first card connector, a second card connector, a first grounding plate and a second grounding plate. The first card connector defines positioning holes for mating with positioning columns of the second card connector. Furthermore, the first, second card connectors and the first, second grounding plates are all define through holes. Bolts are running through the through holes to secure them together.

However, elements of the stacked card connector are excessive so that increasing manufacturing and assembling cost. On the other hand, once the bolts are loose, the first, second card connectors and the first, second grounding plates can't be secured together. Thus, affecting signal transmission.

Hence, an improved card connector is highly desired to overcome the aforementioned disadvantages of the prior art.

SUMMARY OF THE INVENTION

Accordingly, an object of the present invention is to provide a card connector which has secure and simple structures.

To achieve the above object, a card connector comprises an insulating housing and a plurality of contacts received in the insulating housing. The insulating housing comprises a base and a pair of guiding arms extending from opposite lateral sides of the base along a card ejecting direction and defining a card receiving space. The insulating housing is formed with a pair of mating portions, the contacts are received in the mating portions, and the mating portions extend from the base along the card ejecting direction to expose into the card receiving space at a position of upper and lower sides. Each guiding arm is formed with one or more intermediate portions between the mating portions to sustain the electrical card to electrically connect with the corresponding mating portion.

Other objects, advantages and novel features of the present invention will be drawn from the following detailed description of a preferred embodiment of the present invention with attached drawings.

DETAILED DESCRIPTION OF THE INVENTION

Reference will now be made in detail to the preferred embodiment of the present invention.

Figure 1:
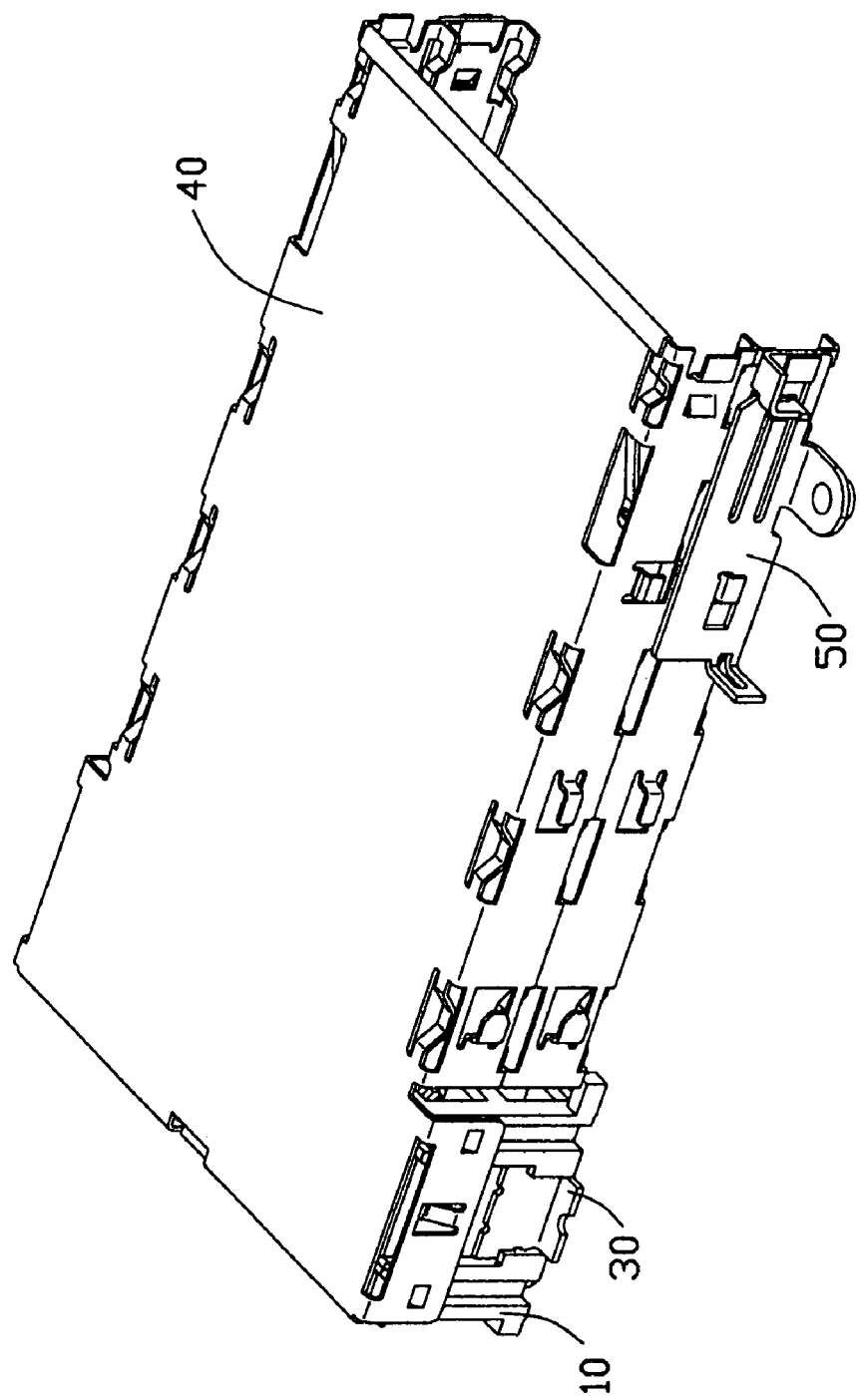
FIG. 1 is an assembled, perspective view of a card connector in accordance with the present invention.
Figure 2:
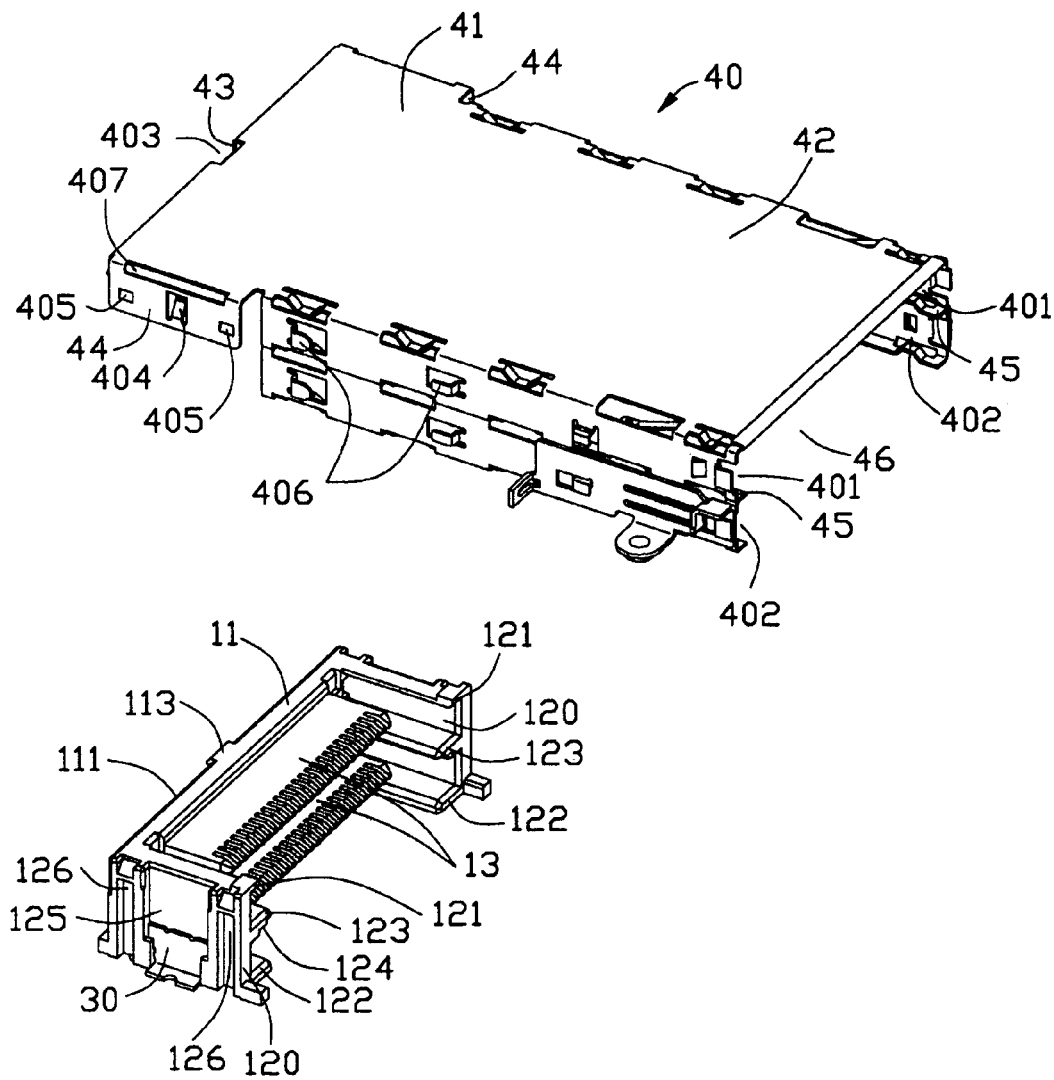
FIG. 2 is a partially exploded, perspective view of the card connector of FIG. 1 with a shell not assembled to an insulating housing.
Figure 3:
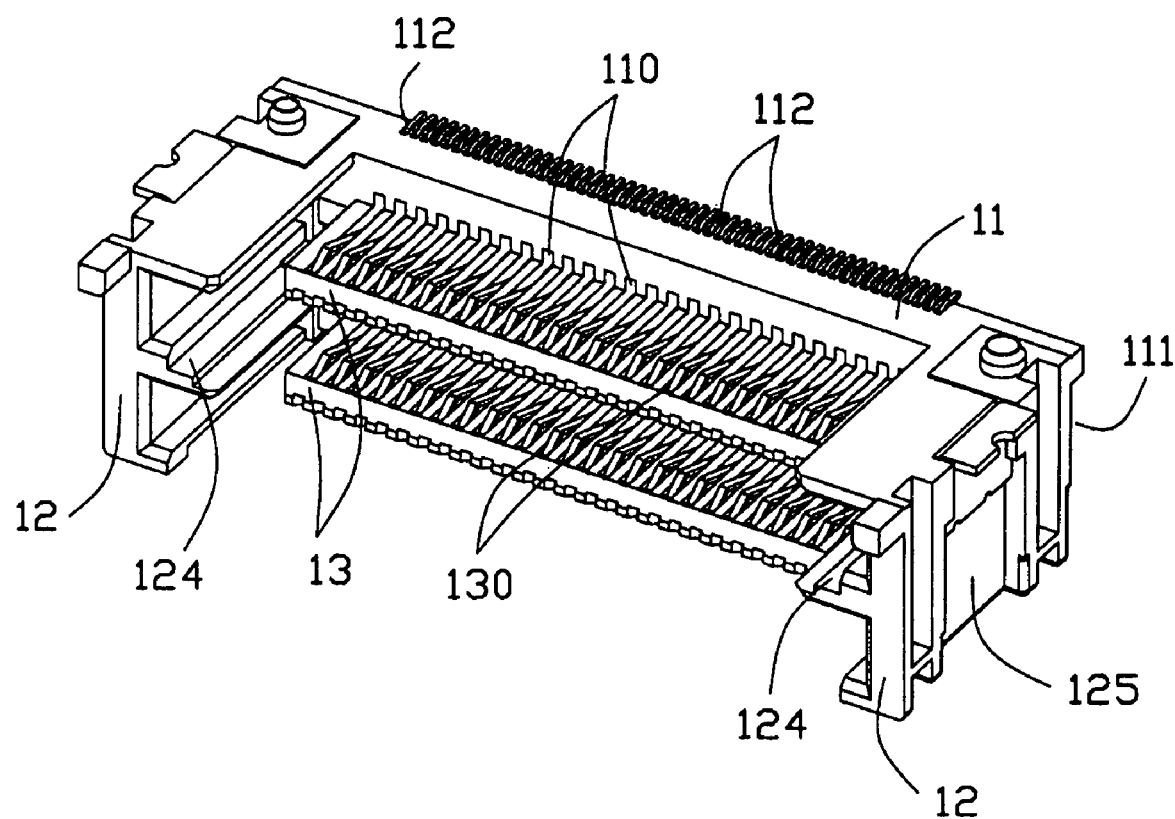
FIG. 3 is a perspective view of the insulating housing of the card connector of FIG. 1, but from another aspect.

Referring to FIGS. 1–3, the card connector in accordance with the present invention is adapted for receiving two electrical cards 60. The card connector comprises an elongated insulating housing 10, a plurality of contacts 20 received in the insulating housing 10, a pair of grounding pieces 30, a shell 40 covering the insulating housing 10 and a pair of standoff devices 50.

Referring to FIGS. 2–3, the elongated insulating housing 10 comprises a base 11, a pair of guiding arms 12 extending rearward from opposite lateral sides of the base 11 and a pair of mating portions 13 extending rearward from the base 11 and locate between the guiding arms 12. A card receiving space (not labeled) is defined among the base 11 and the guiding arms 12. The mating portions 13 are exposed in the card receiving space and arranged in an upper and lower position and spaced from each other. Each mating portion 13 defines a plurality of receiving channels 130 for receiving the contacts 20. The base 11 defines a plurality of passages 110 communicating with the corresponding receiving channels 130 and running through the base 11. A plurality of slots 112 are defined in a lower side of a front face 111 of the base 11 and a locking portion 113 protrudes forwardly from middle portion of an upper side of the front face 111 of the base 11.

Each guiding arm 12 comprises an upright portion 120, an upper and a lower portions 121, 122 extending horizontally face to face from opposite upper and lower sides of the upright portion 120 and an intermediate portion 123 locating between the adjacent mating portions to divide the card receiving space into an upper space (not labeled) and a lower space (not labeled) communicating with the upper space. Distance of the intermediate portion 123 and the upper portion 121 is equal to that of the intermediate portion 123 and the lower portion 122 (referring to FIG. 6). The mating portions 13 are exposed in the upper and lower spaces, respectively. The upright portion 120 defines a receiving slot 125 extending downwardly from the upper side thereof and opening to outside. Recesses 126 recessed inwardly from an outside of the upright portion 120 are defined besides the receiving slots 125.

Figure 4:
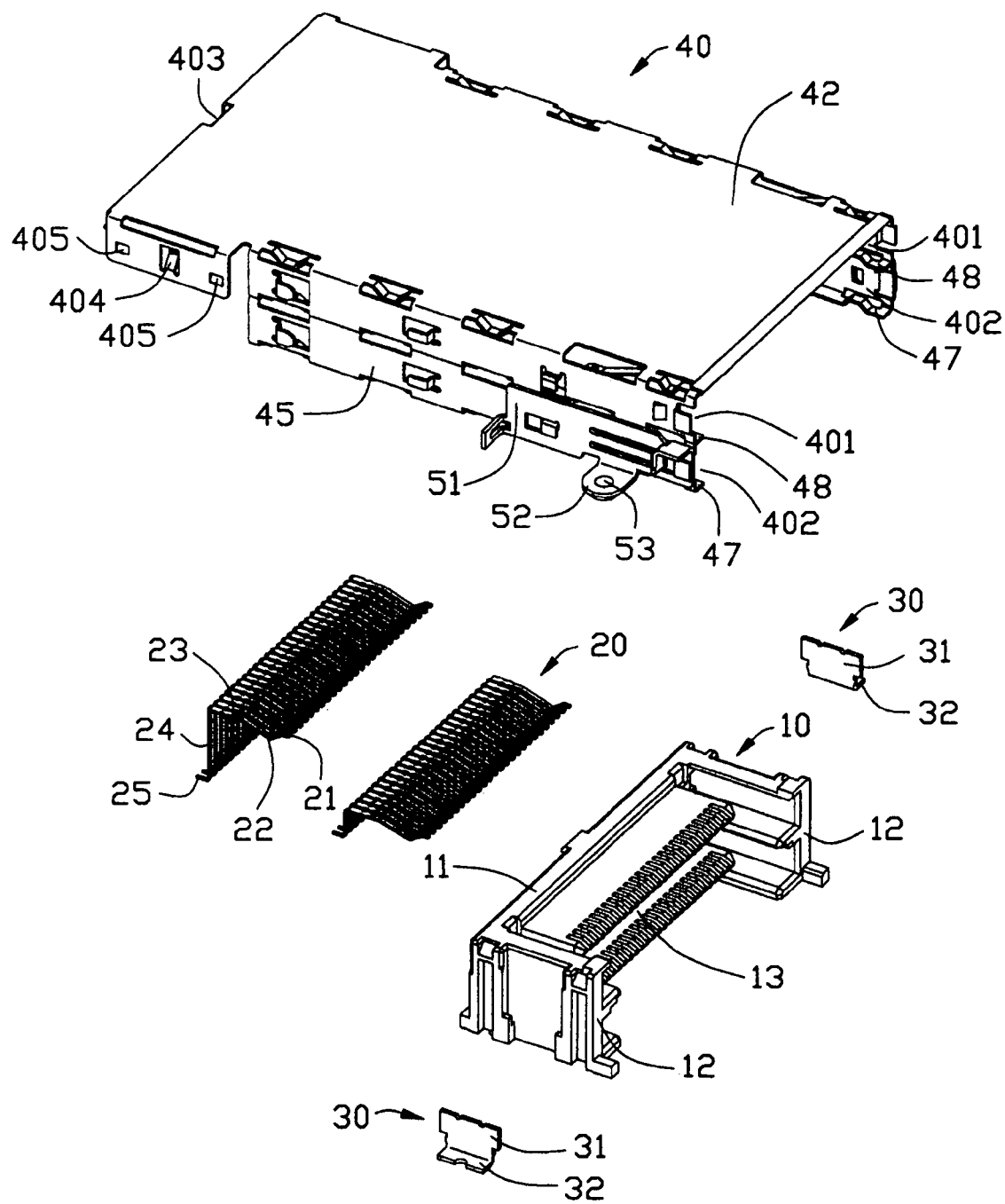
FIG. 4 is an exploded, perspective view of the card connector of FIG. 1.

Referring to FIGS. 2 and 4, the contacts 20 are grouped with upper contacts and lower contacts corresponding to the mating portions 13. Each contact 20 comprises an end portion 21, a contacting portion 22 extending forwardly from the end portion 21, a holding portion 23 extending forwardly from the contacting portion 22, a connecting portion 24 extending downwardly from the holding portion 23 and a soldering portion 25 extending horizontally from the connecting portion 24 for soldering on a printed circuit board (not shown). The end portion 21 is held in the receiving channel 130 and the contacting portion 22 moveably protrudes out of the channel 130, and the holding portion 23 is interferentially secured in the passage 110 of the insulating housing 10. In addition, the connecting portions 24 of the upper and lower contacts of the contacts 20 are respectively extending from right and left sides of the corresponding holding portions 23 of the contacts 20. Therefore, the connecting portions 24 of the upper and lower contacts of the contacts 20 are alternately arranged in the slots 112 of the insulating housing 10.

The grounding pieces 30 are approximately L-shaped. Each grounding piece 30 comprises an upright body 31 interferentially received in the receiving slot 125 and a horizontal body 32 extending from the upright body 31 for soldering on a printed circuit board (not shown).

Referring to FIGS. 2 and 4, the shell 40 is stamped from a metal sheet. The shell 40 comprises a front part (not labeled) and a rear part (not labeled) extending from the front part. The front part covers the insulating housing 10 and comprises a front main body 41, a flange 43 bended downwardly from a front end of the front main body 41 and a pair of sidewalls 44 extending downwardly from opposite lateral sides of the front main body 41. A cutout 403 is defined in the flange 43 to mate with the locking portion 113 of the insulating housing 10. Each sidewall 41 defines a pair of locking pieces 405 for securing in the recesses 126 of the housing 10 and a resilient piece 404 located between the pair of locking pieces 405 to electrically abut against the grounding piece 30. Thus, the front part of the shell 40 securely covers the insulating housing 10.

The rear part of the shell 40 is approximately a frame configuration, defining a cavity (not labeled) with an entrance opening 46 at a rear end thereof to communicate with the card receiving space of the housing 10. The rear part of the shell 40 comprises a rear main body 42 extending from the front main body 41 and a pair of guiding arms 45 extending downwardly from opposite lateral sides of the rear main body 42. Each guiding arm 45 is formed with a first guiding portion 47 and a second guiding portion 48, protruding horizontally into the cavity from a free end and approximately a midsection of the guiding arm 45, respectively. Thus, dividing the cavity into guiding passages 401, 402 communicating with the corresponding upper and lower spaces of the insulating housing 10, respectively. In addition, the shell 4 is formed with a slot 407 and clasps 406 for mounting an ejector (not shown) thereon.

Referring to FIG. 4, each standoff device 50 is disposed on the rear part of the shell 40 adjacent to the entrance opening 46. The standoff device 50 comprises a locking body 51 locking on the shell 40 and a holding body 52 extending perpendicularly to the locking body 51 to mount on the printed circuit board (not shown). A bolt hole 53 is defined in the holding body 52.

Figure 5:
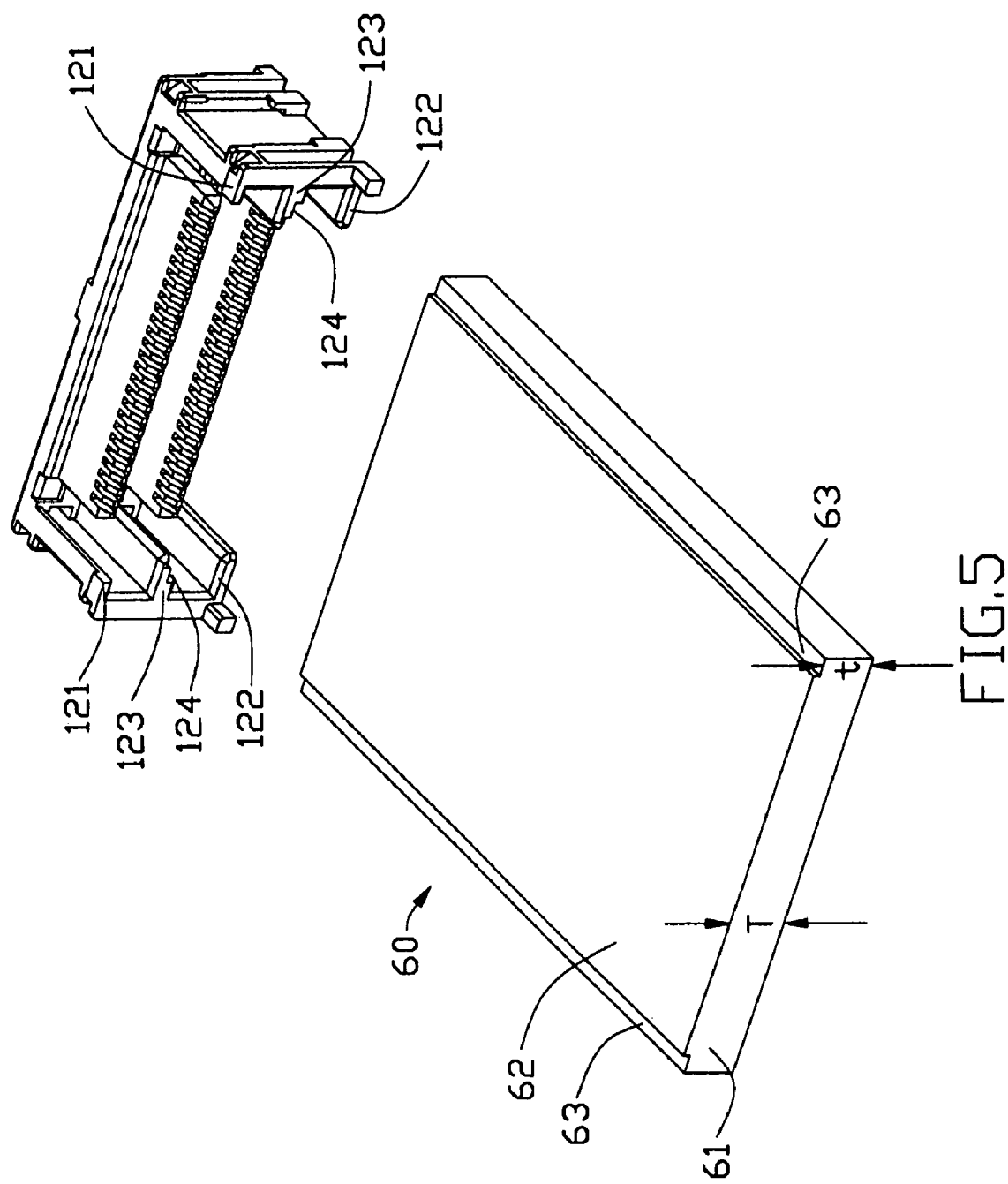
FIG. 5 is perspective views of the insulating housing of the card connector of FIG. 1 and an electrical card.
Figure 6:
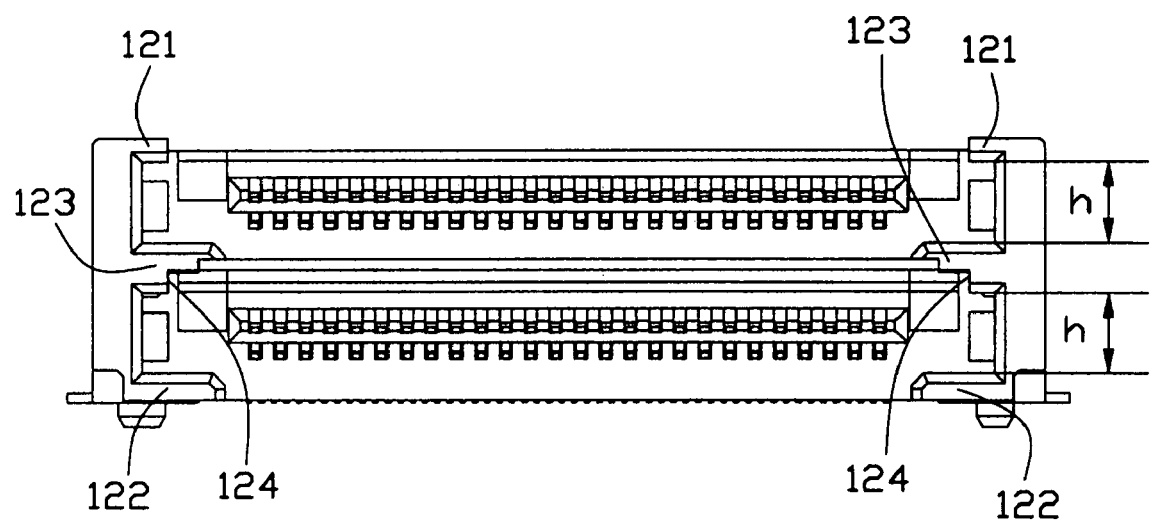
FIG. 6 is a front plane view of the insulating housing of the card connector of FIG. 1.

Referring to FIGS. 5 and 6, the card connector can prevent the electrical card 60 from mismating. Now, explaining as follows: the electrical card 60 is approximately rectangular configuration and defines a receiving portion (not shown) at a front end thereof with a plurality of electrical terminals therein to receive the mating portion 13 of the housing 10. The electrical card 60 is formed with a pair of recess portions 63 recessed downwardly from a top face thereof at opposite lateral sides along a card inserting/ejecting direction. Height of the electrical card 60 is defining as "T" and height of lateral sides of the electrical card 60 is defining as "t". The distance of the intermediate portion 123 and the upper portion 121 and the intermediate portion 123 and the lower portion 122 are both defining as "h", and T>h>t. Furthermore, distance of the pair of recess portions 63 is shorter than the pair of the upper portions 121 and longer than that of the pair of the intermediate portions 123 and the pair of the lower portions 122.

Therefore, when the electrical card 60 is properly inserted, the card 60 will be received in the upper space of the housing 10 to electrically connect with the upper contacts 20. When the electrical card 60 is not proper inserted, because the height "T>h>t" and the distance of the pair of recess portions 63 is longer than that of the pair of the intermediate portions 123, the electrical card 60 isn't inserted into.

Referring to FIG. 5, each intermediate portion 123 is formed with a step portion 124 at a lower face of a free end thereof and exposed into the lower space of the housing 10. When the electrical card 60 is properly inserted, the recess portions 63 are recognized by the step portions 124 and the card 60 is fully received in the lower space. Certainly, the card 60 is not inserted into when improperly inserted.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A card connector adapted for receiving electrical cards, comprising:
    an insulating housing comprising a base and a pair of guiding arms extending from opposite lateral sides of the base along a card ejecting direction and defining a card receiving space;
    a plurality of contacts retained on the insulating housing to electrically connect with the corresponding electrical card;
    the insulating housing formed with a pair of mating portions, the contacts received in the mating portions, the mating portions extending from the base along the card ejecting direction to expose into the card receiving space and arranged in an upper and lower sides and spaced from each other, each guiding arm formed with one or more intermediate portions between the mating portions to sustain the electrical card to electrically connect with the corresponding mating portions;
    wherein the intermediate portions are formed with step portions at free ends thereof to prevent the corresponding electrical card from mismating; and
    wherein the guiding arms comprises upright portions, upper portions and lower portions, and wherein the upper and lower portions extend face to face from opposite upper and lower sides of the upright portions, and the intermediate portions position between the upper and lower portions.

2. The card connector as described in claim 1, wherein the contacts are grouped with upper contacts and lower contacts corresponding to the mating portions, and wherein soldering portions of the upper and lower contacts are alternately arranged in a row.

3. The card connector as described in claim 1, wherein distance of the intermediate portions is shorter than that of the upper portions.

4. The card connector as described in claim 3, wherein distance of the intermediate portions and the upper portions is equal to that of the intermediate portions and the lower portions.

5. The card connector as described in claim 1, further comprising a shell covering the insulating housing.

6. The card connector as described in claim 5, wherein the shell is formed with a slot and clasps to secure an ejector thereon.

7. The card connector as described in claim 5, further comprising a pair of grounding pieces disposed on the insulating housing to electrically connect with the shell.

8. The card connector as described in claim 5, wherein the shell comprises a front part covering the insulating housing and a rear part extending from the front part.

9. The card connector as described in claim 8, wherein the rear part of the shell is approximately a frame configuration and defining a cavity communicating with the card receiving space of the insulating housing to receive the electrical cards.

\* \* \* \* \*